United States Patent [19]
Ikeda et al.

[11] Patent Number: 5,924,024
[45] Date of Patent: Jul. 13, 1999

[54] METHOD AND CIRCUIT FOR ACHIEVING FREQUENCY CONVERSION

[75] Inventors: Yuka Ikeda; Yasunori Kanai, both of Nagano, Japan

[73] Assignee: Shinko Electric Industries, Co., Ltd., Nagano, Japan

[21] Appl. No.: 08/855,416

[22] Filed: May 13, 1997

[30] Foreign Application Priority Data

May 15, 1996 [JP] Japan ..................................... 8-120051
Oct. 18, 1996 [JP] Japan ..................................... 8-276151

[51] Int. Cl.$^6$ ...................................................... H04Q 9/12
[52] U.S. Cl. .......................... 455/313; 455/102; 455/104; 455/109; 455/118
[58] Field of Search ..................................... 455/102, 103, 455/104, 109, 118, 46, 47, 48, 313

[56] References Cited

U.S. PATENT DOCUMENTS 5,373,265 12/1994 Davis et al. ......................... 455/109 X
5,410,747 4/1995 Omhagari et al. ....................... 455/118
5,519,732 5/1996 Chester ................................ 455/103 X

FOREIGN PATENT DOCUMENTS 5-308226 11/1993 Japan .

*Primary Examiner*—Wellington Chin
*Assistant Examiner*—Yemane Woldetatios
*Attorney, Agent, or Firm*—Pennie & Edmonds LLP

[57] ABSTRACT

A frequency conversion method and a frequency conversion circuit which enlarge the frequency difference between the upper and lower sidebands of the output signal so as to enable the undesired sideband to be easily eliminated by a filter even in a case where the frequency of the input signal is low. First, a first excitation signal having a first excitation frequency (Fp) is modulated by an input signal (a) of a predetermined frequency (F1) to produce two sidebands and thereby generate a first intermediate signal (b). Next, a second excitation signal having a second excitation frequency (Fq) lower than the first excitation frequency (Fp) by exactly a frequency twice the frequency of the input signal (a) is modulated by the input signal (a) to produce two sidebands and thereby generate a second intermediate signal (c). Further the first intermediate signal (b) and the second intermediate signal (c) are added so that the lower sideband of the first intermediate signal (b) and the upper sideband of the second intermediate signal (c) are cancelled by each other to thereby generate an output signal (d) composed of the upper sideband of the first intermediate signal (b) and the lower sideband of the second intermediate signal (c). By this, the space between the upper sideband and the lower sideband is widened and thereby the lower band erasing filter can easily erase the lower sideband.

18 Claims, 11 Drawing Sheets

| ORDER | FREQUENCY | Fh |
|---|---|---|
| 1 | Fh1 | (=Fhmin) |
| 2 | Fh2 | |
| 3 | Fh3 | |
| 4 | Fh4 | (=Fhmax) |
| 5 | Fh5 | |

METHOD AND CIRCUIT FOR ACHIEVING FREQUENCY CONVERSION

BACKGROUND OF THE INVENTION

1. Field of the Invention

The present invention relates to a frequency conversion method and a frequency conversion circuit.

Frequency conversion is one of most important processes in for example the field of radio communications. As one example of this, there is frequency conversion by an up-converter. In the present invention, a method and a circuit for performing such frequency conversion will be explained.

2. Description of the Related Art

Taking an up-converter as an example, when the frequency of the input signal is extremely low relative to the carrier frequency at the initial stage frequency conversion circuit and therefore the frequency difference between an upper sideband and a lower sideband becomes small, it becomes necessary to make use of a lower band erasing filter having a sharp cut-off characteristic and a high precision in order to eliminate the frequency components of the lower sideband and under without affecting the upper sideband thereof. However, such a high precision filter is usually expensive and thus there is a problem of a rise of the cost of the frequency conversion circuit.

Further, when the frequency of the input signal is extremely low relative to the carrier frequency, the desired low erasing filter cannot be realized, so the frequency components of the lower sideband and under cannot be eliminated by the conventional frequency conversion method without affecting the upper sideband. Accordingly, there is a problem that the desired frequency conversion cannot be carried out.

SUMMARY OF THE INVENTION

The present invention was made so as to solve the above problems and has as an object thereof to provide a frequency conversion method and a frequency conversion circuit which enlarge the frequency difference between the upper and lower sidebands of the output signal so as to enable the undesired sideband to be easily eliminated by a filter even in a case where the frequency of the input signal is extremely low relative to the carrier frequency.

To attain the above object, in the present invention, first, a first excitation signal having a first excitation frequency (Fp) is modulated by an input signal (a) of a predetermined frequency (P1) to produce two sidebands and thereby generate a first intermediate signal (b). Next, a second excitation signal having a second excitation frequency (Fq) lower than the first excitation frequency (Fp) by exactly a frequency twice the frequency of the input signal (a) is modulated by the input signal (a) to produce two sidebands and thereby generate a second intermediate signal (c). The first intermediate signal (b) and the second intermediate signal (c) are added so that the lower sideband of the first intermediate signal (b) and the upper sideband of the second intermediate signal (c) are cancelled by each other to thereby generate an output signal (d) composed of the upper sideband of the first intermediate signal (b) and the lower sideband of the second intermediate signal (c). By this, the space between the upper sideband and the lower sideband is widened and thereby the lower band erasing filter can easily erase the lower sideband.

Namely, there are provided a frequency conversion apparatus and method which can easily eliminate an undesired sideband by a filter even in a case where the frequency of the input signal is low by enlarging the frequency difference between the upper and lower sidebands of the output signal.

BRIEF DESCRIPTION OF THE DRAWINGS

The above object and features of the present invention will be more apparent from the following description of the preferred embodiments given with reference to the accompanying drawings, wherein.

DESCRIPTION OF THE PREFERRED EMBODIMENTS

Before describing the embodiments of the present invention, the related art and the disadvantages therein will be described with reference to the attached drawings.

An explanation will be made of a conventional frequency conversion method and frequency conversion circuit by using FIG. 16 to FIG. 18. As one example, an explanation will be made of an up-converter for raising the frequency.

Figure 16:
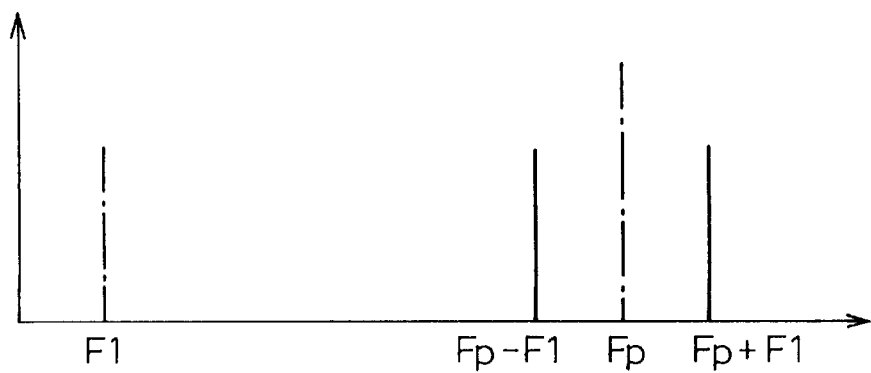
FIG. 16 is a graph showing the frequency components of the intermediate signal under the conventional frequency conversion method.

This frequency conversion method mixes an input signal having a frequency F1 and an excitation signal having an excitation frequency Fp (Fp>F1) to convert them to an output signal having a frequency of the sum (or difference) Fp+F1 (or Fp−F1) between the excitation frequency Fp and the input signal frequency F1 as shown in FIG. 16.

Figure 17:
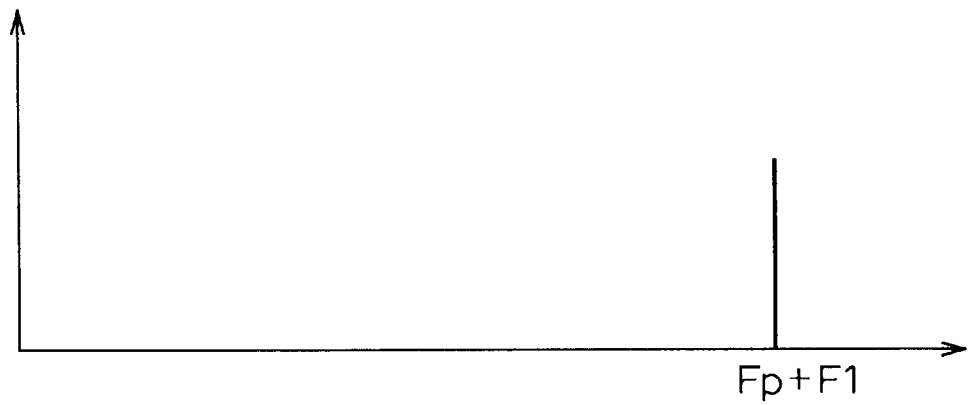
FIG. 17 is a graph showing the frequency components of the converted output signal in the method represented in FIG. 16.

As shown in FIG. 17, this method eliminates the lower sideband (frequency: Fp−F1) from this output signal by a lower band erasing filter and outputs only the upper sideband (frequency: Fp+F1) of the output signal.

This results in an output signal with a frequency which is up-converted from F1 to (Fp+F1).

Figure 18:
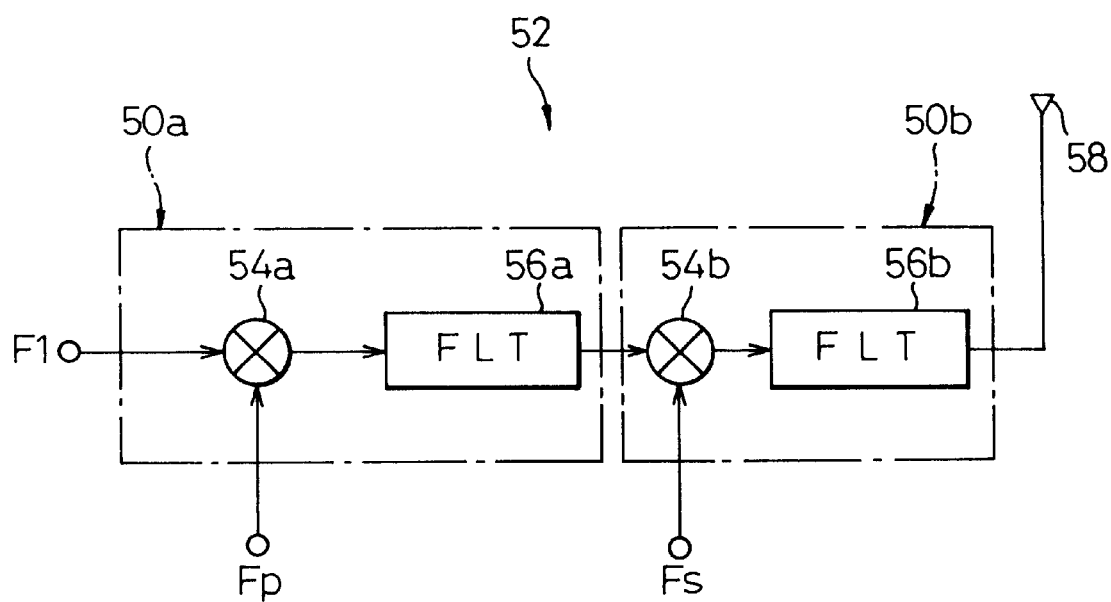
FIG. 18 is a block diagram of the configuration of a frequency conversion circuit according to the method represented in FIG. 16.

By repeatedly applying the above frequency conversion method as shown in FIG. 18, up-conversion to further higher frequencies becomes possible.

One example of the frequency conversion circuit for this frequency conversion method is constituted by a mixer and a lower band erasing filter. A up-converter 52 which uses two of these frequency conversion circuits (50a and 50b) to up-convert the frequency by two steps is shown in FIG. 18.

These frequency conversion circuits 50a and 50b are respectively constituted by mixers 54a and 54b and lower band erasing filters (FLT) 56a and 56b.

According to this up-converter 52, the first stage frequency conversion circuit 50a, as mentioned above, up-converts the frequency (F1) of the input signal to the frequency (Fp+F1).

Further, the following second stage frequency conversion circuit 50b similarly up-converts the frequency to the frequency (Fp+F1+Fs), which is then transmitted from an antenna 58.

Note that, in the frequency conversion circuit 50b, an excitation signal having the excitation frequency Fs (Fs>Fp) is mixed. The frequency Fs is a frequency used for achieving an up conversion to a radio transmission frequency range.

As explained above, however, the above conventional frequency conversion method and frequency conversion circuit have problems.

The frequency conversion circuits 50a and 50b are configured to eliminate the lower sidebands by using the lower band erasing filters 56a and 56b and to output only the upper sidebands. In the frequency conversion circuit, however, the frequency difference between the excitation frequency Fp (or Fs) and the upper and lower sidebands becomes the frequency F1 of the input signal. Therefore, when the frequency of the input signal is extremely low relative to the carrier frequency, as in the initial stage frequency conversion circuit, the frequency difference between the upper sideband and the lower sideband becomes small. Note that, in the rear stage frequency conversion circuit, since the frequency of the signal which is input to this has been up-converted by the preceding stage frequency conversion circuit, there is a sufficient frequency difference (2Fp+2F1) between the upper and lower sidebands of the signal obtained by mixing with the excitation signal having an excitation frequency Fs at the mixer 54b and the modulation to produce both sidebands. Note that, Fs>Fp.

Accordingly, when the frequency of the input signal is extremely low relative to the carrier frequency in the initial stage frequency conversion circuit and the frequency difference between the upper sideband and the lower sideband therefore becomes small, it is necessary to use a filter having a sharp cut-off characteristic and high precision in order to eliminate the frequency components of the lower sideband and under without affecting the upper sideband. A filter of such a high precision is usually expensive, so there is the previously mentioned problem that the cost of the frequency conversion circuit is raised.

Further, where the frequency of the input signal is extremely low relative to the carrier frequency, the desired lower band erasing filter cannot be realized and therefore this conventional frequency conversion method is unable to eliminate the frequency components of lower sideband without affecting the upper sideband. Accordingly, there is the above problem that the frequency conversion cannot be carried out.

The present invention was made so as to solve the above problems and provides a frequency conversion method and frequency conversion circuit which enlarge the frequency difference between the upper and lower sidebands of the output signal to thereby enable the undesired sideband to be easily eliminated by a filter even when the frequency of the input signal is extremely low relative to the carrier frequency.

For this purpose, the present invention is configured as follows:

Namely, according to a frequency conversion method of a first embodiment according to the present invention, a first excitation signal having a first excitation frequency is modulated by an input signal of predetermined frequency to produce the two sidebands and thereby generate a first intermediate signal. A second excitation signal having a second excitation frequency lower than the first excitation frequency by exactly a frequency of twice the frequency of the input signal is modulated by the input signal to produce two sidebands and thereby generate a second intermediate signal. The first intermediate signal and the second intermediate signal are added so that the lower sideband of the first intermediate signal and the upper sideband of the second intermediate signal are cancelled by each other to thereby generate an output signal composed of the upper sideband of the first intermediate signal and the lower sideband of the second intermediate signal.

According to this method, the frequency interval between the upper and lower sidebands of the signal generated by adding the intermediate signals is enlarged to a frequency four times the frequency of the input signal, therefore the elimination of either sideband can be easily carried out by the filter.

Further, according to a frequency conversion method of a second embodiment according to the present invention, first, a first excitation signal having a first excitation frequency is modulated to produce two sidebands by using an input signal changing in frequency at predetermined time intervals according to a predetermined frequency pattern to thereby generate a first intermediate signal. Next, a second excitation signal having a second excitation frequency lower than the first excitation frequency by exactly a frequency obtained by adding the maximum frequency and minimum frequency of the frequency pattern is modulated to produce two sidebands by using a sub-input signal having a frequency lower than the frequency obtained by adding the maximum frequency and minimum frequency of the frequency pattern by exactly the frequency of the input signal to thereby generate a second intermediate signal. Further, the first intermediate signal and the second intermediate signal are added so the lower sideband of the first intermediate signal and the upper sideband of the second intermediate signal are cancelled by each other. Thus, an output signal composed of the upper sideband of the first intermediate signal and the lower sideband of the second intermediate signal is generated.

According to the above method, the frequency difference between the upper and lower sidebands in the output signal can be enlarged even for an input signal with such frequency hopping.

Further, a frequency conversion circuit of a first embodiment according to the present invention is provided with a first mixer which mixes a first excitation signal having a first excitation frequency and an input signal having a predetermined frequency to generate a first intermediate signal; a second mixer which mixes a second excitation signal having a second excitation frequency lower than the first frequency by exactly a frequency twice the frequency of the input signal and the input signal to generate a second intermediate signal; and an adder which adds the first intermediate signal and the second intermediate signal so the lower sideband of the first intermediate signal and the upper sideband of the second intermediate signal cancel each other to thereby generate an output signal composed of the upper sideband of the first intermediate signal and the lower sideband of the second intermediate signal.

According to the above configuration, the frequency interval between the upper and lower sidebands of the signal generated by adding the intermediate signals is enlarged to a frequency four times the frequency of the input signal. Accordingly, the elimination of either sideband can be easily carried out by the filter.

Further, a frequency conversion circuit according to a second embodiment of the present invention is provided with a first signal generator for outputting an input signal changing in frequency at predetermined time intervals according to a predetermined frequency pattern; a second signal generator for outputting a sub-input signal having a lower frequency than the frequency obtained by adding the maximum frequency and minimum frequency of the frequency pattern by exactly the frequency of the input signal; a local oscillator for generating a first excitation signal having a first excitation frequency and a second excitation signal having a second excitation frequency lower than the first excitation frequency by exactly the frequency obtained by adding the maximum frequency and minimum frequency of the frequency pattern; a first mixer for mixing the first excitation signal and the input signal to generate a first intermediate signal; a second mixer for mixing the second excitation signal and the sub-input signal to generate a second intermediate signal; and an adder for adding the first intermediate signal and the second intermediate signal so the lower sideband of the first intermediate signal and the upper sideband of the second intermediate signal cancel each other to thereby generate an output signal composed of the upper sideband of the first intermediate signal and the lower sideband of the second intermediate signal.

According to this, the frequency difference between the upper and lower sidebands of the output signal can be enlarged even in an input signal with frequency hopping.

Below, preferred specific examples of the frequency conversion method and the frequency conversion circuit according to the present invention will be explained in detail based on the attached drawings.

First embodiment

Figure 1:
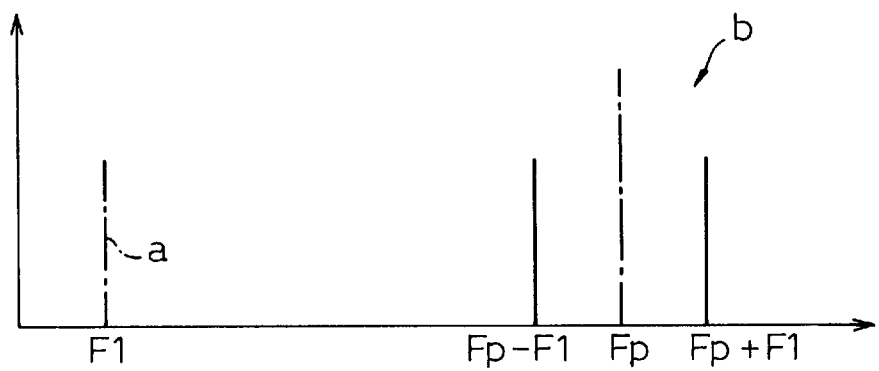
FIG. 1 is a graph showing the frequency components of a first intermediate signal in a first embodiment of a frequency conversion method according to the present invention.
Figure 2:
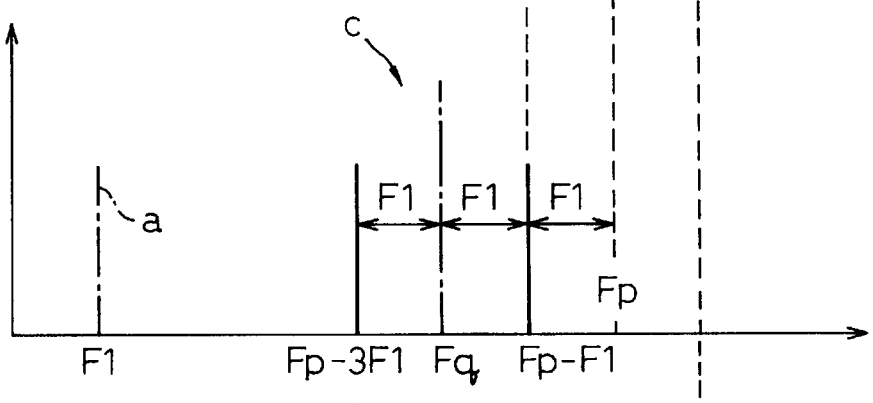
FIG. 2 is a graph showing the frequency components of a second intermediate signal in the first embodiment.
Figure 3:
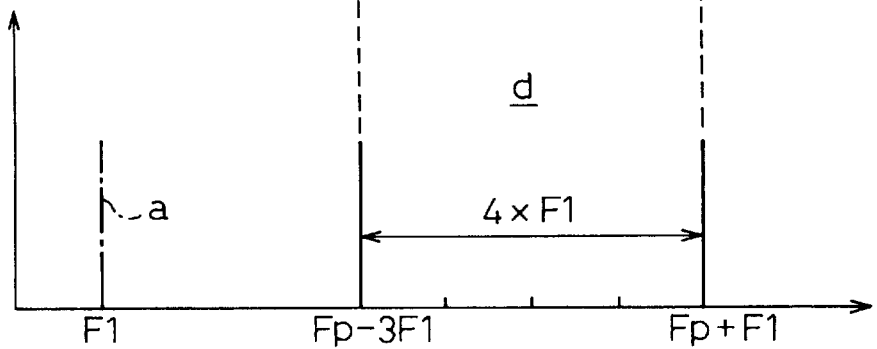
FIG. 3 is a graph showing the frequency components when the intermediate signals of FIG. 1 and FIG. 2 are added to each other.

FIG. 1 is a graph showing the frequency components of a first intermediate signal in the first embodiment of the frequency conversion method according to the present invention; FIG. 2 is a graph showing the frequency components of a second intermediate signal in the first embodiment; and FIG. 3 is a graph showing the frequency components when the intermediate signals of FIG. 1 and FIG. 2 are added to each other.

First, an explanation will be made of the frequency conversion method by using FIG. 1 to FIG. 3. Note that, the description will be made taking as an example a method in which the frequency of the input signal to be converted is defined as F1, and this frequency is up-converted up to the frequency (Fp+F1). Note that, Fp>F1.

First, the first excitation signal having the first excitation frequency Fp is modulated by using the input signal (a) to produce two sidebands and generate a first intermediate signal (b). The generated first intermediate signal (b) is composed of an upper sideband having a frequency (Fp+F1) and a lower sideband having a frequency (Fp−F1).

The first intermediate signal (b) may be represented by the following equation:

$$\sin(2\pi F1t) \times \sin(2\pi Fpt) = [-\cos\{(Fp+F1)2\pi t\}]/2 \qquad \text{'''(1)}$$

Further, the second excitation signal having a second excitation frequency (Fq=Fp−2×F1) lower than the first excitation frequency Fp by exactly a frequency twice the frequency F1 of the input signal is modulated by using the input signal (a) to produce two sidebands and generate a second intermediate signal (c). The generated second intermediate signal (c) is composed of an upper sideband having a frequency (Fq+F1) and a lower sideband having a frequency (Fp−F1).

The second intermediate signal (c) may be represented by the following equation:

$$\sin(2\pi F1t) \times \sin(2\pi Fqt) = [-\cos\{(Fq+F1)2\pi t\} + \qquad (2)$$
$$\cos\{(Fq-F1)2\pi t\}]/2$$
$$= [-\cos\{(Fp-F1)2\pi t\} + \cos\{(Fp-3\times F1)2\pi t\}]/2$$

This is because, Fq=Fp−2×F1

Second, these first intermediate signal (b) and second intermediate signal (c) are added. By this addition, the lower sideband of the first intermediate signal (b) (second term of Equation (1)) and the upper sideband of the second intermediate signal (c) (first term of Equation (2)) are cancelled by each other, and an output signal (d) composed of only both the upper sideband of the first intermediate signal (b) and the lower sideband of the second intermediate signal (c) is generated. Note, the signal (b) and the signal (c) are opposite in phase from each other.

The output signal (d) may be represented by the following equation:

Equation (1)+Equation (2)

$$=[-\cos\{(Fp+F1)2\pi t\}+\cos\{(Fp-3\times F1)2\pi t\}]/2 \qquad \text{'''(3)}$$

Accordingly, the frequency difference between the upper and lower sidebands of the generated output signal becomes:

$$|Fp+F1-(Fp-3\times F1)|=4\times F1$$

and is enlarged to four times the frequency F1 of the input signal.

Then, last, the lower sideband of the output signal (d) (second term of Equation (3)) is eliminated by the lower band erasing filter to thereby generate a signal converted (up-converted) to the frequency (Fp+F1) (first term of Equation (3)).

First Embodiment of Circuit

Figure 4:
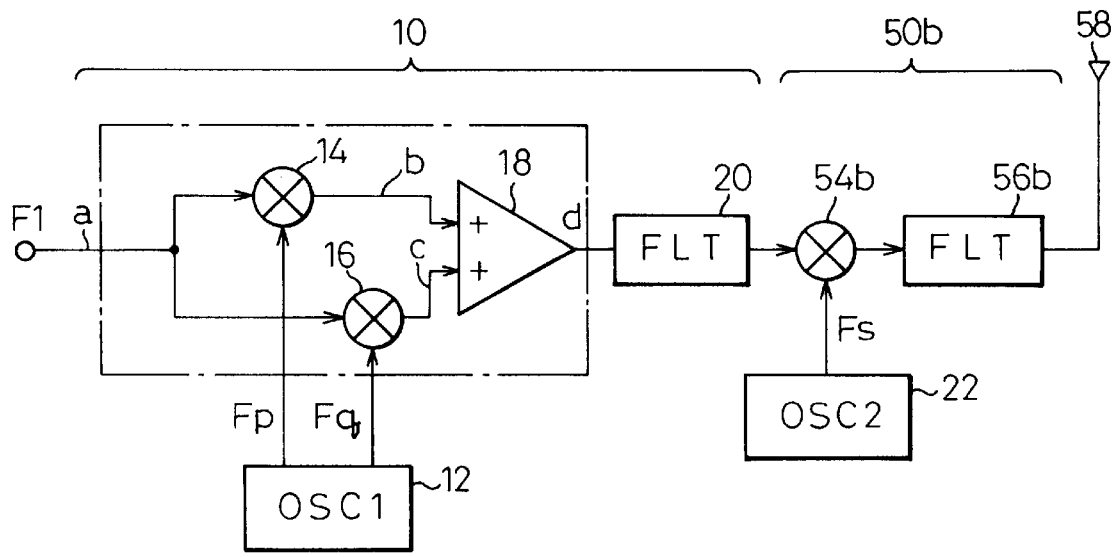
FIG. 4 is a block diagram of the configuration of a first embodiment of a frequency conversion circuit according to the present invention where the frequency difference between the upper and lower sidebands of the output signal is enlarged four-fold.

FIG. 4 is a block diagram of the configuration of the first embodiment of the frequency conversion circuit according to the present invention where the frequency between the upper and lower sidebands of the output signal is enlarged four-fold.

The frequency conversion circuit 10 has the following configuration.

Reference numeral 12 shows a local oscillator (OSC1) for outputting a first excitation signal having a first excitation frequency Fp and a second excitation signal having a second excitation frequency Fg=(Fp−2×F1).

Reference numeral 14 shows a first mixer which mixes the first excitation signal and the input signal (a) having the predetermined frequency F1 to generate the first intermediate signal (b).

Reference numeral 16 shows a second mixer which mixes the second excitation signal and the input signal (a) to generate the second intermediate signal (c).

Reference numeral 18 shows an adder which adds the first intermediate signal (b) and the second intermediate signal (c).

By this addition, as mentioned above, the lower sideband of the first intermediate signal (b) and the upper sideband of the second intermediate signal (c) are cancelled by each other, and an output signal composed of only the upper sideband of the first intermediate signal (b) and the lower sideband of the second intermediate signal (c) is generated.

Reference numeral 20 shows a lower band erasing filter configured so as to eliminate signals of a frequency (Fp−3×F1) or less. Accordingly, only the upper sideband of the output signal (d) is output from this lower band erasing filter 20. As a result, the frequency F1 of the input signal (a) is converted (up-converted) to the frequency (Fp+F1).

By mixing and adding the signals as mentioned above, the frequency difference between the upper and lower sidebands of the output signal (d) is enlarged to four times the frequency F1 of the input signal.

As a result of this, separation of the upper and lower sidebands of the output signal (d) (Fp+F1, Fp−F1), which could not be achieved by the conventional frequency conversion circuit when the frequency F1 of the input signal was low and separated unless by using a lower band erasing filter having a sharp cut-off characteristic and high precision, can be achieved according to the frequency conversion method and the frequency conversion circuit of the present invention even without using a lower band erasing filter having a sharp cut-off characteristic and high precision since the frequency interval between the upper and lower sidebands of the output signal (d) (Fp+F1, Fp−3×F1) is enlarged as described above. Accordingly, it becomes possible to reduce tho cost of the lower band erasing filter.

Further, the problem of the inability to realize a low erasing filter having a sharp cut-off characteristic and high precision and therefore the inability to perform frequency conversion in the prior art when the frequency F1 of the input signal was particularly low can be overcome by the enlargement of the frequency difference between the upper and lower sidebands of the output signal (d).

A frequency conversion circuit 50b is arranged at the rear stage of the frequency conversion circuit 10 of FIG. 4 so as to convert the frequency of the input signal (a) to a further higher frequency in the same way as in the conventional art.

This frequency conversion circuit 50b comprises a third mixer 54b, a second local oscillator (OSC2) 22, and a lower band erasing filter 56b.

In the rear stage frequency conversion circuit 50b, since the frequency of the signal input to this has already been up-converted by the front stage frequency conversion circuit 10 to the frequency (Fp+F1), there is a sufficient frequency difference (2Fp+2F1) between the upper and lower sidebands of the signal obtained by the mixing in the third mixer 54b with the second excitation signal having the third excitation frequency Fs from the second local oscillator 22 and modulation to produce the two sidebands. Accordingly, the separation of the upper and lower sidebands is possible without using a sharp lower band erasing filter. Note that, Fs>Fp.

Further, it is possible to similarly generate third and fourth excitation signals respectively having a frequency lower than the first excitation frequency Fp by four times the input signal and and a frequency lower than the same by six times the input signal to generate third and fourth intermediate signals in parallel to the second intermediate signal (c) and add the same to the first intermediate signal (b) so as to enlarge the frequency difference between the upper and lower sidebands of the output signal to six times, eight times, etc. the frequency of the input signal.

Figure 5:
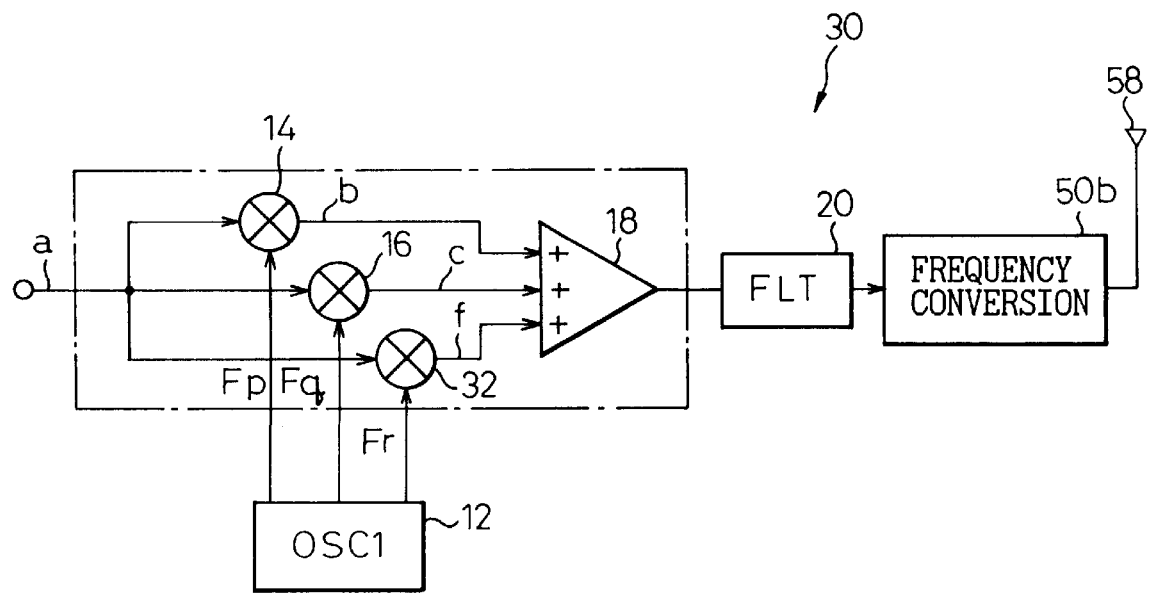
FIG. 5 is a block diagram of the configuration of a modification of the first embodiment of the frequency conversion circuit for enlarging the frequency difference between the upper and lower sidebands of the output signal six-fold.

FIG. 5 is a block diagram of the configuration of a modification of the first embodiment of the frequency conversion circuit for enlarging the frequency between the upper and lower sidebands of the output signal six-fold. Note that, a frequency conversion circuit 50b is connected to the rear of this frequency conversion circuit 30 similar to FIG. 4, but is represented simply here.

The configuration of the frequency conversion circuit 30 corresponds to the configuration of the frequency conversion circuit 10 shown in FIG. 4 except for the addition of a fourth mixer 32 and, at the same time, generation of a third excitation signal having a third excitation frequency Fr (=Fp−4×F1) from the first local oscillator 12. The fourth mixer 32 mixes the third excitation signal and the input signal (a) to generate a third intermediate signal (f). The first intermediate signal (b), the second intermediate signal (c), and the third intermediate signal (f) are added at the adder 18.

By this configuration, the lower sideband of the first intermediate signal (b) and the upper sideband of the second intermediate signal (c) are cancelled by each other, and the lower sideband of the second intermediate signal (c) and the upper sideband of the third intermediate signal (f) are cancelled by each other, and thus an output signal composed of only the upper sideband of the first intermediate signal (b) and the lower sideband of the third intermediate signal (f) is generated from the adder 18.

By this, the frequency difference between the upper and lower sidebands of the output signal is enlarged to six times the frequency of the input signal.

The same applies when enlarging the frequency difference between the upper and lower sidebands of the output signal to eight times the frequency of the input signal. Although not illustrated, it is sufficient to generate a fourth excitation signal having a fourth excitation frequency Fs (=Fp−6×F1) from the first local oscillator 12, add a fourth mixer and mix this with the input signal (a) to generate a fourth intermediate signal, and add the first intermediate signal (b), the second intermediate signal (c), the third intermediate signal (f), and the fourth intermediate signal at the adder 18. By this, an output signal composed of only both the upper sideband of the first intermediate signal (b) and the lower sideband of the fourth intermediate signal is generated from the adder 18. By this, the frequency difference between the upper and lower sidebands of this output signal is enlarged to eight times the frequency of the input signal.

Explaining the above modification more abstractly, it comprises i) a step of modulating a third excitation signal (fourth excitation signal, '") having a third excitation frequency (fourth excitation frequency, '") lower than a first excitation frequency by exactly a frequency four times (six times '") the frequency of the input signal by the input signal to produce two sidebands to generate a third intermediate signal (fourth intermediate signal, '") and ii) a step of further adding a second intermediate signal (third intermediate signal, '") to a first intermediate signal so that the lower sideband of each intermediate signal and the upper sideband of the intermediate signal adjoining the same are cancelled by each other to thereby generate an output signal composed of the upper sideband of the first intermediate signal and the lower sideband of the intermediate signal most separated from the first intermediate signal.

The circuit realizing the above modification a) further has an additional mixer or mixers for mixing the third excitation signal (fourth excitation signal, '") having a third excitation frequency (fourth excitation frequency, '") lower than the first excitation frequency by exactly a frequency four times (six times, '") the frequency of the input signal and the input signal to generate the third intermediate signal (fourth intermediate signal, '"); and b) the adder adds also the third intermediate signal (fourth intermediate signal, '") in addition to the first intermediate signal and the second intermediate signal so the lower sideband of each intermediate signal and the upper sideband of the intermediate signal adjoining the same are cancelled by each other to generate an output signal composed of the lower sideband of the intermediate signal most separated from the first intermediate signal.

Second Embodiment

In the above first embodiment, the frequency of the input signal (a) was fixed to a predetermined value, but the present invention is not limited to this. The frequency conversion according to the present invention can also be applied to an input signal (a) which undergoes frequency hopping according to a predetermined frequency pattern.

Specifically, there is a configuration for mixing and up-converting the frequency of an input signal (a) which undergoes frequency hopping. For example, this configuration is used for a modulation circuit for a spread spectrum system using frequency hopping.

Such an input signal (a) with frequency hopping is usually generated by using a DDS (digital direct synthesizer). In this case, the upper limit of the frequency which can be generated by the DDS is about 100 Megahertz.

Accordingly, when the up conversion is carried out by mixing, the frequency difference between the upper and lower sidebands after the mixing is small and thus a lower band erasing filter having a sharp cut-off characteristic and high precision must be used. Accordingly, the frequency conversion circuit according to the present invention is advantageous in such a case.

Figure 6:
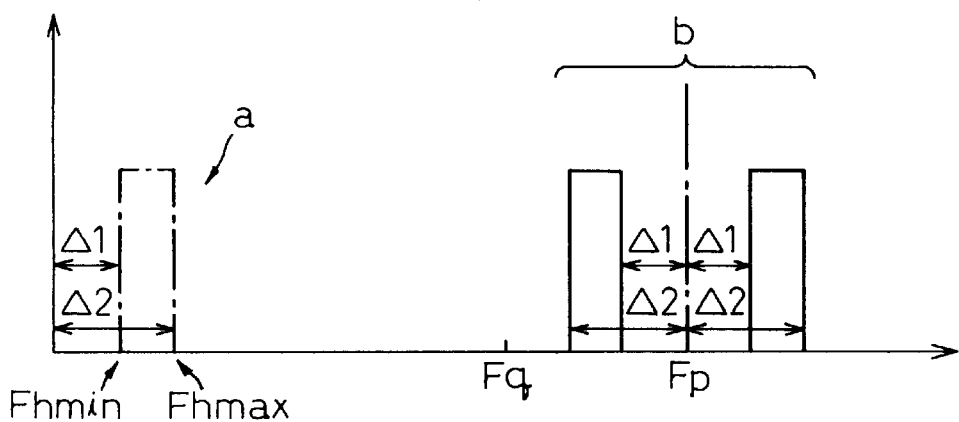
FIG. 6 is a graph showing the frequency components of the first intermediate signal in a second embodiment of the frequency conversion method according to the present invention.
Figure 7:
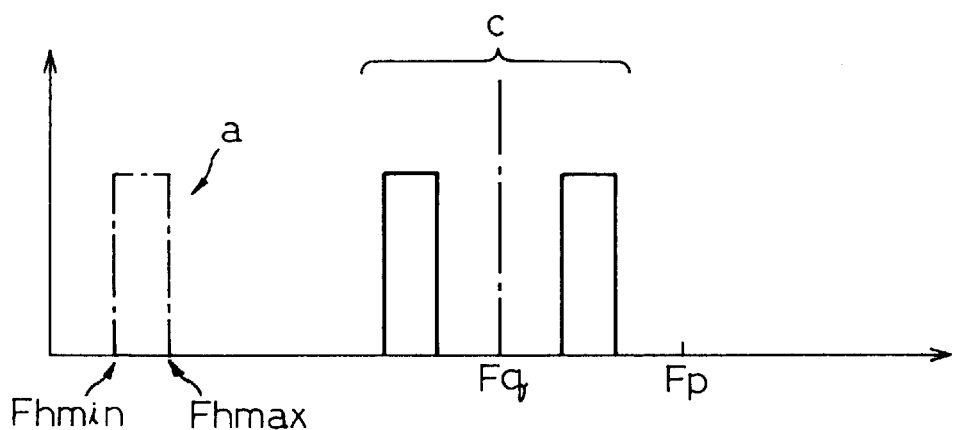
FIG. 7 is a graph showing the frequency components of the second intermediate signal in the second embodiment of the frequency conversion method according to the present invention.
Figure 8:
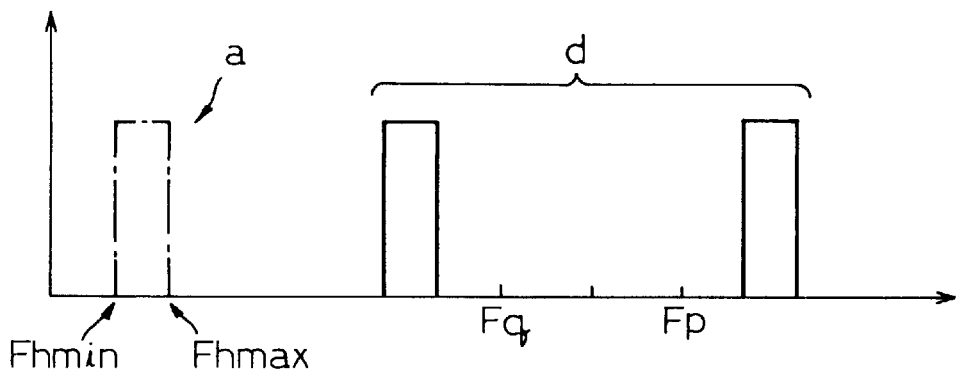
FIG. 8 is a graph showing the frequency components when the intermediate signals of FIG. 6 and FIG. 7 are added to each other.
Figures 9, 10:
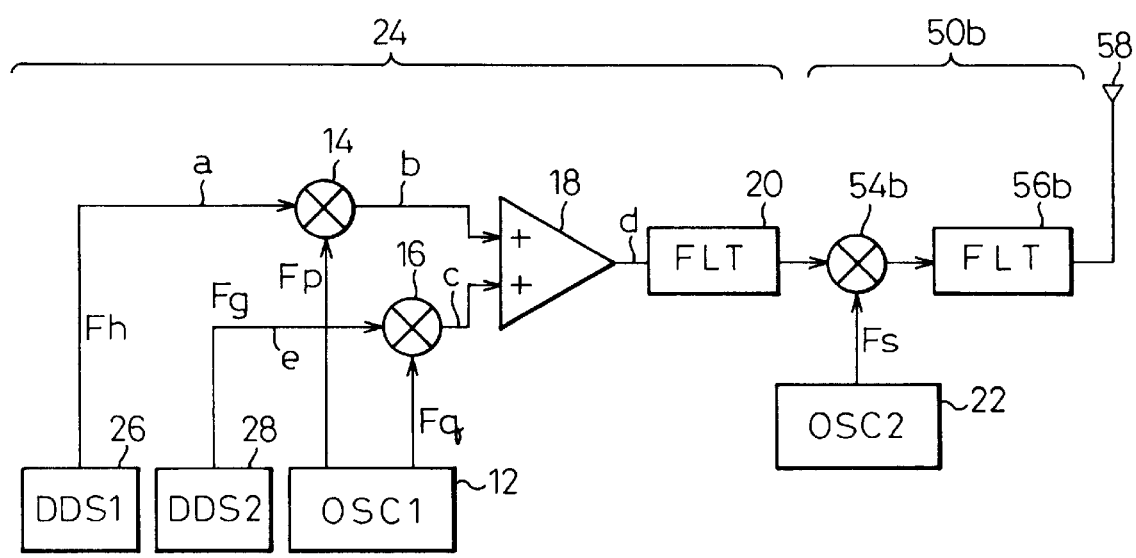
FIG. 9 is a table showing frequency hopping patterns in the second embodiment.
FIG. 10 is a block diagram of the configuration of a second embodiment of the frequency conversion circuit according to the present invention.

FIG. 6 is a graph showing the frequency components of the first intermediate signal in the second embodiment of the frequency conversion method according to the present invention; FIG. 7 is a graph showing the frequency components of the second intermediate signal in the second embodiment of the frequency conversion method according to the present invention; FIG. 8 is a graph showing the frequency components when the intermediate signals of FIG. 6 and FIG. 7 are added to each other; FIG. 9 is a table showing frequency hopping patterns in the second embodiment; and FIG. 10 is a block diagram of the configuration of the second embodiment of the frequency conversion circuit according to the present invention.

Below, an explanation will be made of the configuration and operation of a frequency conversion circuit 24 (FIG. 10) which up-converts an input signal (a) with frequency hopping according to for example the spread spectrum system by using FIG. 6 to FIG. 10. Note that, the same symbols or numerals are given to parts of the configuration similar to those of the first embodiment and explanations thereof will be omitted. First, in FIG. 10, reference numeral 26 shows a first DDS (DDS1) used as the first signal generator which generates an input signal (a) having predetermined frequencies Fh according to tho hopping pattern shown in FIG. 9. This input signal (a) becomes an original signal to be up-converted. The frequency is changed by the hopping pattern at predetermined time intervals to Fh1, Fh2, '", Fh5, Fh1, '" according to the prescribed order. Note that, it is assumed that Fh1 is the lowest frequency Fhmin and Fh4 is the highest frequency Fhmax.

Reference numeral 20 shows a second DDE (DDE2) used as the second signal generator. The second DDS 28 generates a sub-input signal (a) having a frequency Fg satisfying the following equation at the same timing as the hopping performed in the first DDS 26.

$$Fg=Fhmin+Fhmax-Fh \qquad '''(4)$$

The local oscillator 12 generates a first excitation signal having a first excitation frequency Fp. Further, it generates a second excitation signal having a second excitation frequency Fq.

Here, $$Fq=Fp-(Fhmin+Fhmax) \qquad '''(5)$$

The first mixer 14 mixes the first excitation signal and the input signal (a) which is output from the first DDS 26 and changes in frequency Fh according to the hopping pattern shown in FIG. 9. Then, it generates the first intermediate signal (b). This first intermediate signal (b) is composed of the upper and lower sidebands as shown in FIG. 6. The frequency band width of each sideband becomes (Fhmax−Fhmin). Further, the upper limit and lower limit of the frequency of the upper sideband become (Fp+Fhmax) and (Fp+Fhmin), respectively. Further, the upper limit and lower limit of the frequency of the lower sideband become (Fp−Fhmin) and (Fp−Fhmax), respectively.

The second mixer 16 mixes the second excitation signal and the sub-input signal (e) which is output from the second DDS 28 and hops in frequency Fg while satisfying the above Equation (4) together with the first excitation signal. Then, it generates the second intermediate signal (c). This second intermediate signal (c) is composed of the upper and lower sidebands as shown it FIG. 7. The frequency band width of each sideband becomes (Fhmax−Fhmin). Further, the upper limit and lower limit of the frequency of the upper sideband become (Fq+Fhmax) and (Fq+Fhmin), respectively. Further, the upper limit and lower limit of the frequency of the lower sideband become (Fq−Fhmin) and (Fq−Fhmax), respectively.

When these first intermediate signal (b) and second intermediate signal (c) are added at the adder 18, the result is:

$$\sin(2\pi Fht) \times \sin(2\pi Fpt) + \sin(2\pi Fgt) \times \sin(2\pi Fqt) = [-\cos\{(Fp + Fh)2\pi t\} + \cos\{(Fp - Fh)2\pi t\}]/2 + \quad (6)$$
$$[-\cos\{(Fq + Fg)2\pi t\} + \cos\{(Fq - Fg)2\pi t\}]/2$$
$$= [-\cos\{(Fp + Fh)2\pi t\} + \cos\{(Fp - Fh)2\pi t\}]/2 +$$
$$[-\cos\{(Fp - Fh)2\pi t\} + \cos\{(Fp - 2 \times (Fhmin + Fhmax) + Fh)2\pi t\}]/2$$

Accordingly, the frequency difference between the upper and lower sidebands of the generated output signal (d) becomes:

$$|Fp+Fh - Fp+2\times(Fhmin+Fhmax)-Fh|=2\times(Fhmin+Fhmax) \text{ (refer to FIG. 8).}$$

Then,

2×(Fhmin+Fhmax)≧2×(Fhmin+Fh)>2×Fh stands, therefore the frequency difference is enlarged in comparison with the frequency difference (2×Fh) in the case of the conventional frequency converter for simply mixing the frequency Fh of the input signal and up-converting the same.

Accordingly, similar to the first embodiment, the frequency interval is enlarged as described above, therefore it is possible to eliminate the frequency components of the lower sideband and under without using an expensive lower band erasing filter having a sharp cut-off characteristics and high precision and without affecting the upper sideband.

Accordingly, the up-conversion of the frequency can be more cheaply carried out.

Figure 11:
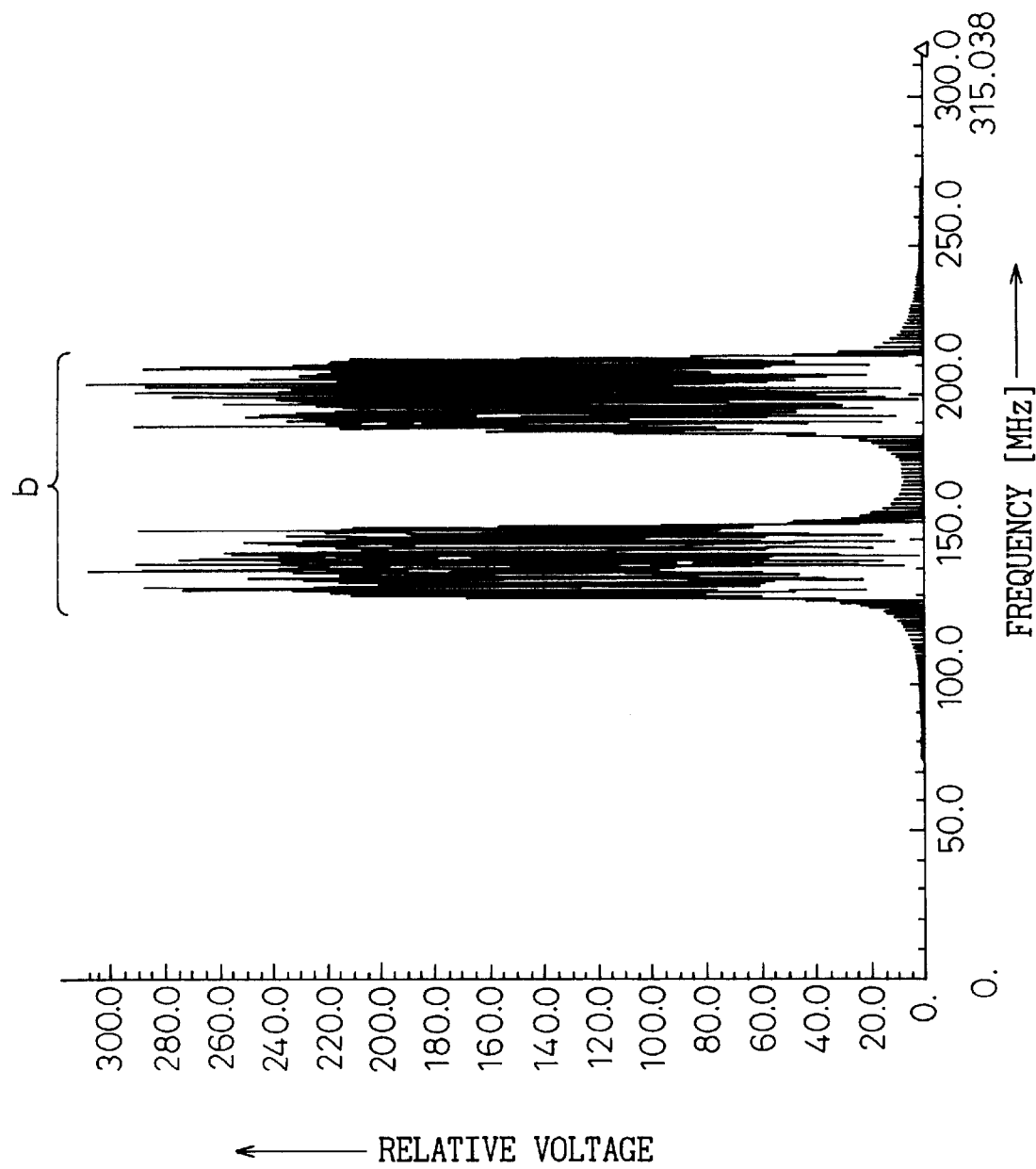
FIG. 11 shows the frequency spectrum of a computer simulated result of observation of the upper and lower sidebands in FIG. 6.
Figure 12:
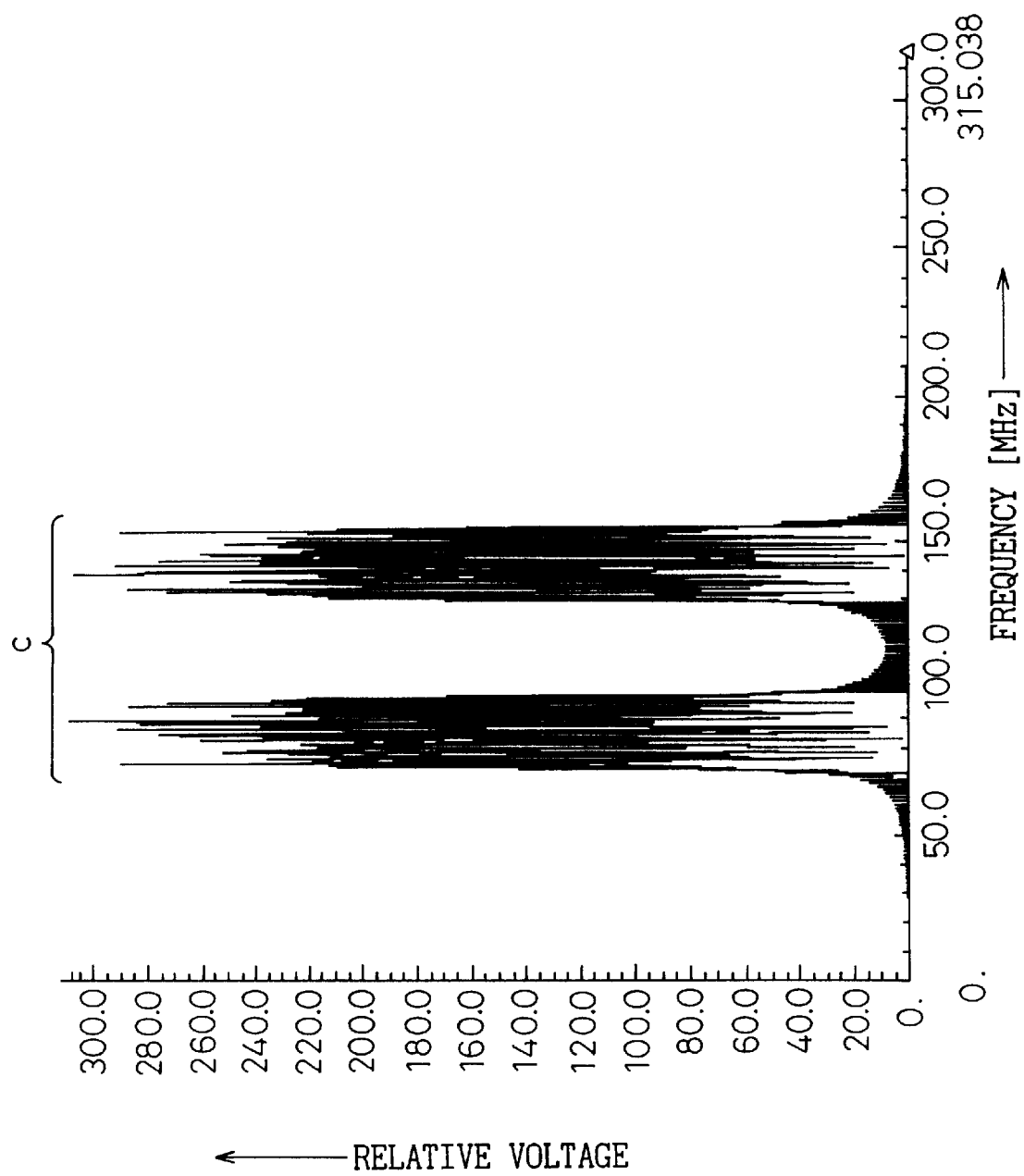
FIG. 12 shows the frequency spectrum of a computer simulated result of observation of the upper and lower sidebands in FIG. 7.
Figure 13:
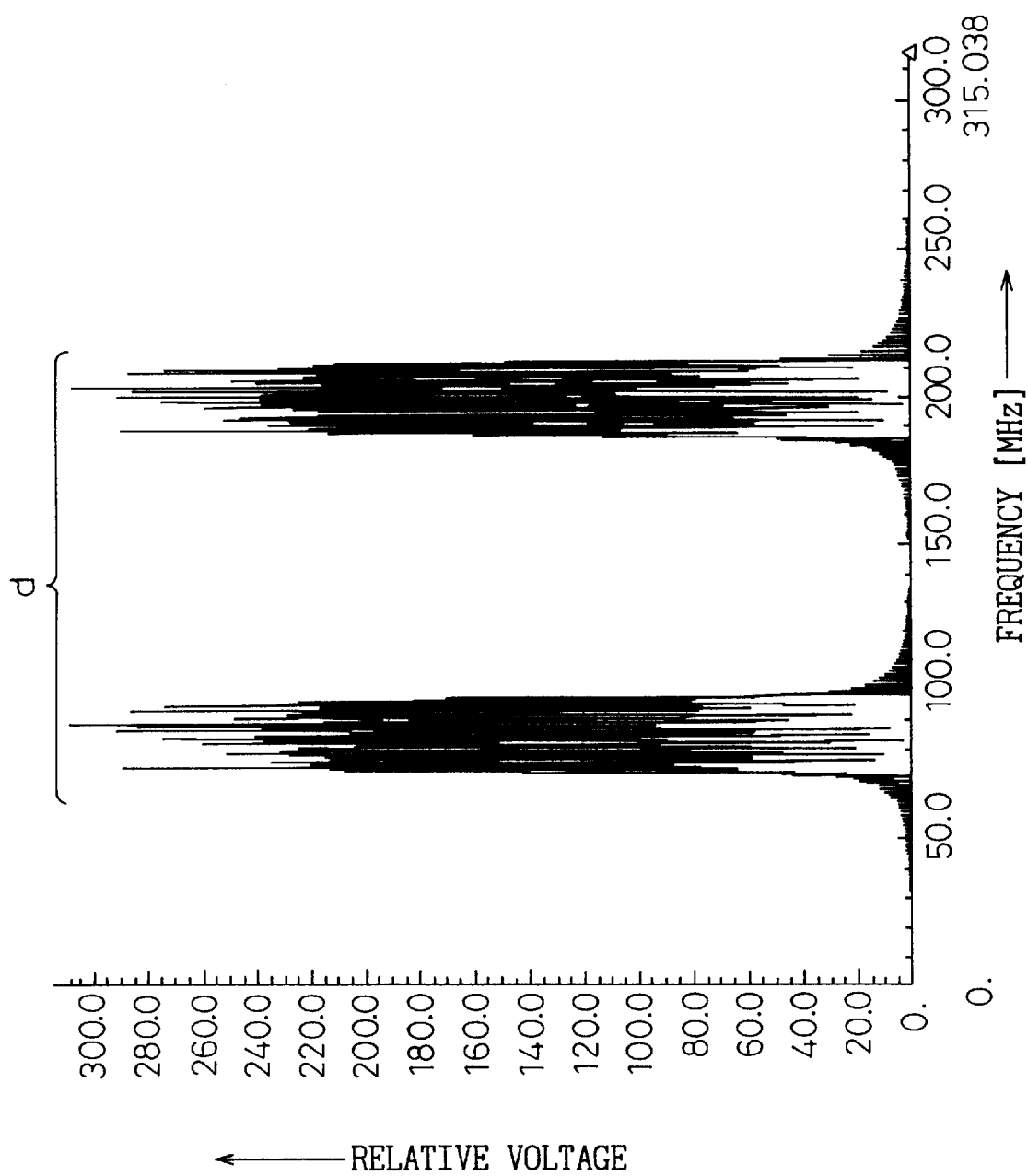
FIG. 13 shows the frequency spectrum of a computer simulated result of observation of the upper and lower sidebands in FIG. 8.

FIG. 11 shows the frequency spectrum of a computer simulated result of observation of the upper and lower sidebands in FIG. 6; FIG. 12 shows the frequency spectrum of a computer simulated result of observation of the upper and lower sidebands in FIG. 7; and FIG. 13 shows the frequency spectrum of a computer simulated result of observation of the upper and lower sidebands in FIG. 8.

In the diagrams, the ordinates show the relative voltage, and the abscissas show the frequency (in MHz). The spectrum of FIG. 11 corresponds to the first intermediate signal (b) in FIG. 6, the spectrum of FIG. 12 corresponds to the second intermediate signal (c) in FIG. 7, and the spectrum of FIG. 13 corresponds to an added intermediate signal (d) shown in FIG. 8.

Figure 14A:
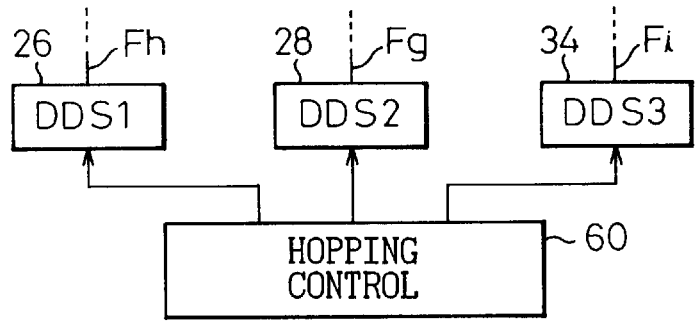
FIG. 14A, FIG. 14B, and FIG. 14C are diagrams for explaining the interrelation among a first signal generator 26, a second signal generator 28, and a third signal generator 34 in FIG. 15.
Figure 14B:
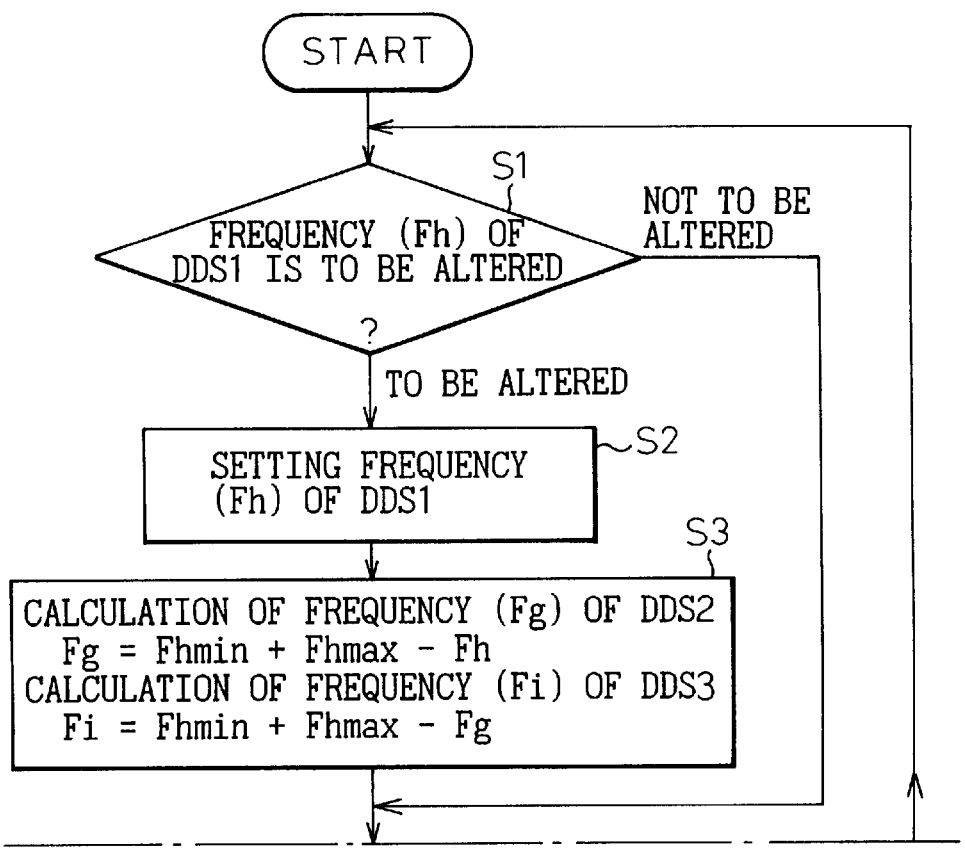
Figure 15:
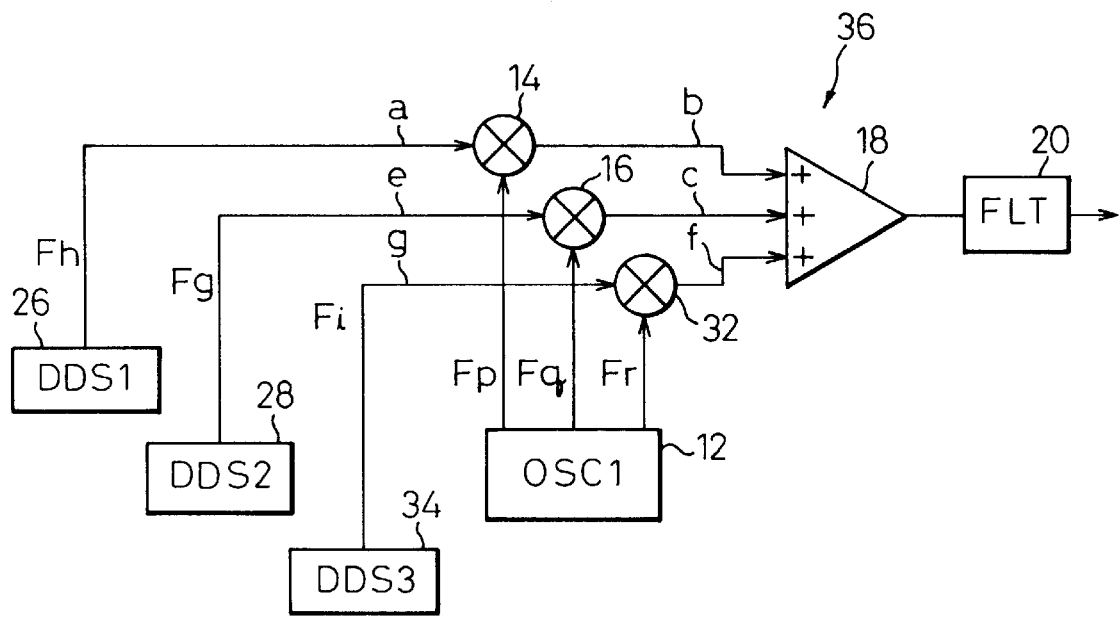
FIG. 15 is a block diagram of a modification of the second embodiment of the frequency conversion circuit obtained by adding a third signal generator to FIG. 13.

FIGS. 14A and 14B are diagrams for explaining the interrelationship among the first signal generator 26, the second signal generator 28, and the third signal generator 34 in FIG. 15.

In order to form the above interrelationship, in a preferred example, the frequency conversion circuit is further provided with a hopping control means. This hopping control means is represented by a block indicated by reference numeral 60 in FIG. 14A.

Figure 14C:
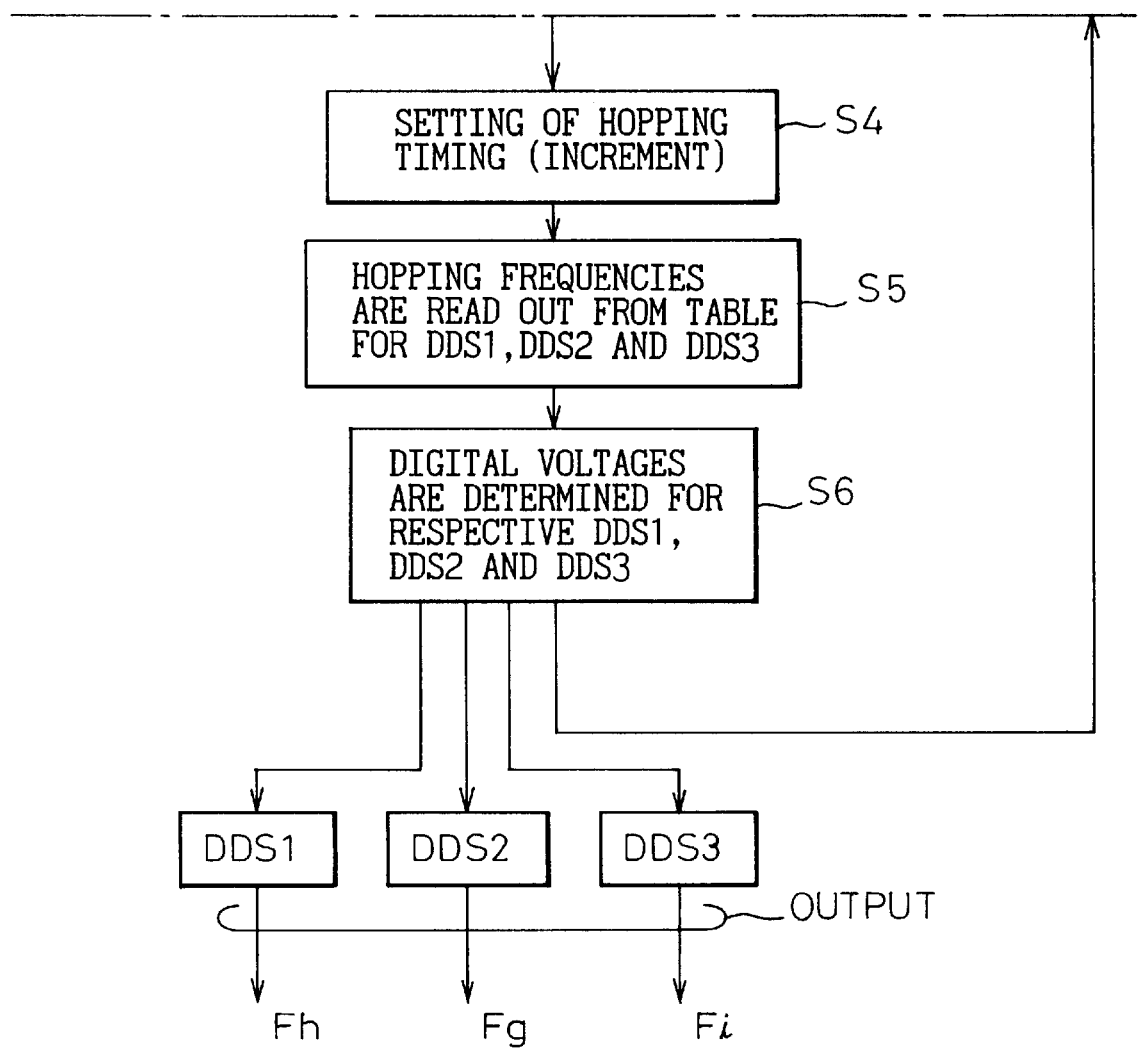

An example of the operation of this hopping control means 60 is given in the flowcharts of FIG. 14B and FIG. 14C. That is, Step S1: First, it is checked whether or not the frequency (Fh) of the output signal from the digital direct synthesizer DDS1 (26) is to be altered.

Step S2: when the frequency (Fh) is to be altered, the frequency (Fh) of the output signal which should be output next is set.

Step S3: The frequency (Fg) of the output signal from the DDS2 (28) is set based on the above corresponding equation by using that frequency (Fh). (Note that, in the case of the frequency conversion circuit shown in FIG. 10, the routine then proceeds to step S4.)

Further, the frequency (Fi) of the output signal from the DDS3 (34) is set based on the above corresponding equation by using that set frequency (Fg).

Step S4: The order (hopping timing) shown in FIG. 9 is incremented by one.

Step S5: Hopping frequencies corresponding to the above order shown in FIG. 9 are read from the table (not illustrated) for every DDS. (Note that, in the case of the circuit shown in FIG. 10, when the hopping frequencies for DDS1 (26) and DDS2 (28) are read, the operation routine reaches step S6.)

Step S6: Digital voltages corresponding to respective hopping frequencies assigned to the DDS1 (26), DDS2 (28), and DDS3 (34) are determined.

In short, the frequency conversion circuit of the present invention is further provided with a hopping control means 60 which performs control so that the above DDS1 (26) and DDS2 (28) generate output signals having frequencies related to each other at the same timings as each other.

Alternatively, it is further provided with a hopping control means 60 which performs control so that the above DDS1 (2C) and DDS3 (38) and additional DDS's (DDS3''') generate output signals having frequencies related to each other at the same timings as each other.

FIG. 15 is a block diagram of a frequency conversion circuit obtained by adding a third signal generator to FIG. 13.

It is possible to add the third signal generator (DDS) 34 to the frequency conversion circuit 24 of FIG. 10 to form the frequency conversion circuit 36 shown in FIG. 15 and further enlarge the frequency difference between the upper and lower sidebands in the output signal output from the adder 18.

The third DDS 34 generates a sub-input signal (g) having a frequency Fi satisfying the following equation with respect to the frequency Fg at the same timing as the hopping performed in the first signal generator (DDS) 26. This equation is the same as the relationship satisfied by Fg with respect to Fh, that is, the relationship indicated by Equation (4), and becomes:

$$Fi=Fhmin+Fhmax-Fg=Fh.$$

Accordingly, it is also possible to use the input signal (a) output from the first DDS 26 as the sub-input signal (g) in place of addition of the third DDS 34.

Further, a third excitation signal having a frequency Fr satisfying the following equation with respect to the frequency Fq is further generated from the local oscillator 12. This equation is the same as the relationship to be satisfied by Fq with respect to Fp, that is, the relationship indicated by Equation (5).

$Fr=Fq-(Fhmin+Fhmax)=Fp-2\times(Fhmin+Fhmax)$

Then, the sub-input signal (g) and the third excitation signal are mixed by using the fourth mixer 32 to thereby generate a third intermediate signal (f) in parallel with the second intermediate signal (c). Then, by adding the first to third intermediate signals at the adder 18, the frequency difference between the upper and lower sidebands of the output signal from the adder 18 can be further enlarged.

Also, by further adding another DDS and mixer and further generating a fourth intermediate signal and a fifth intermediate signal in parallel with the second intermediate signal similar to the above third intermediate signal and then adding the same, the frequency difference can be further enlarged.

Explaining the above modification in more general terms, it includes i) a step of modulating a third excitation signal (fourth excitation signal, '") having a third excitation frequency (fourth excitation frequency, '") lower than a second excitation frequency (third excitation frequency, '") by exactly a frequency obtained by adding a maximum frequency and minimum frequency of a frequency pattern to produce two sidebands by using an additional sub-input signal (further sub-input signal, '") having a frequency lower than the frequency obtained by adding the maximum frequency and minimum frequency of the frequency pattern by exactly the frequency of the input signal to thereby generate a third intermediate signal (fourth intermediate signal '") and ii) a step of further adding the third intermediate signal (fourth intermediate signal, '") to the first intermediate signal so the lower sideband of each intermediate signal and the upper sideband of the intermediate signal adjoining the same are cancelled by each other to thereby generate an output signal composed of the upper sideband of the first intermediate signal and the lower sideband of the intermediate signal most separated from the first intermediate signal.

Further, when frequency conversion for up-conversion is carried out, it includes iii) a step of performing a filter operation for extracting only the upper sideband of the first intermediate signal.

In the circuit realizing the above modification a) further provision is made of an additional signal generator or signal generators for outputting an additional sub-input signal or further sub-input signal having a frequency lower than the frequency obtained by adding the maximum frequency and the minimum frequency of the frequency pattern by exactly the frequency of the sub-input signal;

b) the local oscillator is operative to generate the third excitation signal (fourth excitation signal, '") having a third excitation frequency (fourth excitation frequency, '") lower than the second excitation frequency (third excitation frequency, '") by exactly the frequency obtained by adding the maximum frequency and the minimum frequency of the frequency pattern;

c) further provision is made of an additional mixer or mixers for mixing the third excitation signal (fourth excitation signal, '") and the input signal and producing the third intermediate signal (fourth intermediate signal, '"); and d) the adder adds also the third intermediate signal (fourth intermediate signal, '") in addition to the first intermediate signal and the second intermediate signal so the lower sideband of each intermediate signal and the upper sideband of the intermediate signal adjoining the same are cancelled by each other to thereby generate an output signal composed of the lower sideband of the intermediate signal most separated from the first intermediate signal.

Note that, if the frequency conversion circuit acts as an up-converter, it further has a lower band erasing filter connected to the output of the adder.

While preferred embodiments of the present invention were explained above, the present invention is not limited to the above embodiments. Of course many modifications can be made within a range not exceeding the spirit of the present invention.

If the frequency conversion technology according to the present invention is used, even in a case where the frequency of the input signal is low, by mixing the input signal and the excitation signal, the frequency difference between the upper and lower sidebands of the signal output can be enlarged. For this reason, the frequency conversion becomes possible even if an expensive filter having a sharp cut-off characteristic is not used as the lower band erasing filter for eliminating the lower sideband. Accordingly, the invention has the remarkable effect that the frequency conversion of the input signal can be cheaply and reliably carried out.

What is claimed is:

1. A frequency conversion method comprising:

a first step of modulating a first excitation signal having a first excitation frequency by an input signal of a predetermined frequency to produce two sidebands and thereby generate a first intermediate signal;

a second step of modulating a second excitation signal having a second excitation frequency lower than said first excitation frequency by exactly a frequency twice the frequency of said input signal by said input signal to produce two sidebands and thereby generate a second intermediate signal; and a third step of adding said first intermediate signal and said second intermediate signal so a lower sideband of the first intermediate signal and an upper sideband of the second intermediate signal are cancelled by each other to thereby generate an output signal composed of the upper sideband of the first intermediate signal and the lower sideband of the second intermediate signal.

2. A frequency conversion method according to claim 1, wherein:

said second step further includes a step of modulating a third excitation signal (fourth excitation signal, '") having a third excitation frequency (fourth excitation frequency, '") lower than said first excitation frequency by exactly a frequency four times (six times, '") the frequency of said input signal to produce two sidebands by said input signal to thereby generate a third intermediate signal (fourth intermediate signal, '") and said third step further includes a step of further adding said second intermediate signal (third intermediate signal, '") to said first intermediate signal so the lower sideband of each intermediate signal and the upper sideband of the intermediate signal adjoining the same are cancelled by each other to thereby generate an output signal composed of the upper sideband of said first intermediate signal and the lower sideband of the intermediate signal most separate from the first intermediate signal.

3. A frequency conversion method according to claim 1, further comprising a fourth step of performing a filter operation for extracting only either the upper or the lower sideband of said first intermediate signal where a frequency conversion for up-conversion is carried out.

4. A frequency conversion method according to claim 2, further comprising a fourth step of performing an operation for extracting only either the upper or the lower sideband of said first intermediate signal where a frequency conversion for up-conversion is carried out.

5. A frequency conversion method comprising:
   a first step of modulating a first excitation signal having a first excitation frequency to produce two sidebands by using an input signal which changes in frequency at predetermined time intervals according to a predetermined frequency pattern to thereby generate a first intermediate signal;
   a second step of modulating a second excitation signal having a second excitation frequency lower than said first excitation frequency by exactly a frequency obtained by adding the maximum frequency and minimum frequency of said frequency pattern to produce two sidebands by using a sub-input signal having a frequency lower than the frequency obtained by adding the maximum frequency and minimum frequency of said frequency pattern by exactly the frequency of said input signal to thereby generate the second intermediate signal; and
   a third step of adding said first intermediate signal and said second intermediate signal so that the lower sideband of the first intermediate signal and the upper sideband of the second intermediate signal are cancelled by each other to thereby generate an output signal composed of the upper sideband of the first intermediate signal and the lower sideband of the second intermediate signal.

6. A frequency conversion method according to claim 5, wherein:
   said second step further includes a step of modulating a third excitation signal (fourth excitation signal, ''') having a third excitation frequency (fourth excitation frequency, ''') lower than said second excitation frequency (third excitation frequency, ''') by exactly a frequency obtained by adding the maximum frequency and the minimum frequency of said frequency pattern to produce two sidebands by using an additional sub-input signal (further sub input signal, ''') having a frequency lower than the frequency obtained by adding the maximum frequency and the minimum frequency of said frequency pattern by exactly the frequency of said input signal to thereby generate a third intermediate signal (fourth intermediate signal, ''') and
   said third step includes a step of further adding said third intermediate signal (fourth intermediate signal, ''') to said first intermediate signal so that the lower sideband of each intermediate signal and the upper sideband of the intermediate signal adjoining the same are cancelled by each other to thereby generate an output signal composed of the upper sideband of said first intermediate signal and the lower sideband of the intermediate signal most separated from the first intermediate signal.

7. A frequency conversion method according to claim 5, wherein: it further contains a fourth step of performing a filter operation for extracting only either the upper or the lower sideband of said first intermediate signal where a frequency conversion for up-conversion is carried out.

8. A frequency conversion method according to claim 6, further comprising a fourth step of performing an operation for extracting only either the upper or the lower sideband of said first intermediate signal where a frequency conversion for up-conversion is carried out.

9. A frequency conversion circuit provided with:
   a first mixer which mixes a first excitation signal having a first excitation frequency and an input signal having a predetermined frequency to generate a first intermediate signal;
   a second mixer which mixes a second excitation signal having a second excitation frequency lower than said first frequency by exactly a frequency twice the frequency of said input signal and said input signal to generate a second intermediate signal; and
   an adder which adds said first intermediate signal and said second intermediate signal so that the lower sideband of the first intermediate signal and the upper sideband of the second intermediate signal are cancelled by each other to thereby generate an output signal composed of the upper sideband of the first intermediate signal and the lower sideband of the second intermediate signal.

10. A frequency conversion circuit according to claim 9, wherein:
    further provision is made of an additional mixer or mixers for mixing a third excitation signal (fourth excitation signal, ''') having a third excitation frequency (fourth excitation frequency, ''') lower than said first frequency by exactly a frequency four times (six times, ''') the frequency of said input signal and said input signal to thereby generate a third intermediate signal (fourth intermediate signal, ''') and
    said adder adds also said third intermediate signal (fourth intermediate signal, ''') in addition to said first intermediate signal and said second intermediate signal so that the lower sideband of each intermediate signal and the upper sideband of the intermediate signal adjoining the same are cancelled by each other to thereby generate an output signal composed of the lower sideband of the intermediate signal most separate from said first intermediate signal.

11. A frequency conversion circuit comprising:
    a first signal generator for outputting an input signal which changes in frequency at predetermined time intervals according to a predetermined frequency pattern;
    a second signal generator for outputting a sub-input signal having a frequency lower than a frequency obtained by adding the maximum frequency and minimum frequency of said frequency pattern by exactly the frequency of said input signal;
    a local oscillator for generating a first excitation signal having a first excitation frequency and a second excitation signal having a second excitation frequency lower than the first excitation frequency by exactly the frequency obtained by adding the maximum frequency and minimum frequency of said frequency pattern;
    a first mixer for mixing said first excitation signal and said input signal to thereby generate a first intermediate signal;
    a second mixer for mixing said second excitation signal and said sub-input signal to thereby generate a second intermediate signal; and
    an adder for adding said first intermediate signal and said second intermediate signal so the lower sideband of the first intermediate signal and the upper sideband of the second intermediate signal are cancelled by each other to thereby generate an output signal composed of the upper sideband of the first intermediate signal and the lower sideband of the second intermediate signal.

12. A frequency conversion circuit according to claim 11, wherein:
  further provision is made of an additional signal generator or signal generators outputting an additional sub-input signal or further sub-input signal having a frequency lower than the frequency obtained by adding the maximum frequency and the minimum frequency of said frequency pattern by exactly the frequency of said sub-input signal;
  said local oscillator is operative to generate a third excitation signal (fourth excitation signal, ''') having a third excitation frequency (fourth excitation frequency, ''') lower than said second excitation frequency (third excitation frequency, ''') by exactly the frequency obtained by adding the maximum frequency and the minimum frequency of said frequency pattern;
  further provision is made of an additional mixer or mixers for mixing said third excitation signal (fourth excitation signal, ''') and said input signal to thereby produce a third intermediate signal (fourth intermediate signal, '''); and
  said adder adds also said third intermediate signal (fourth intermediate signal, ''') in addition to said first intermediate signal and said second intermediate signal so that the lower sideband of each intermediate signal and the upper sideband of the intermediate signal adjoining the same are cancelled by each other to thereby generate an output signal composed of the lower sideband of the intermediate signal most separate from said first intermediate signal.

13. A frequency conversion circuit according to claim 9 acting as an up-converter, wherein it further has a band pass filter connected to the output of said adder.

14. A frequency conversion circuit according to claim 10 acting as an up-converter, wherein it further has a band pass filter connected to the output of said adder.

15. A frequency conversion circuit according to claim 13, wherein a second stage frequency conversion unit comprising another mixer, another local oscillator, and another band pass filter is provided in the rear of said band pass filter.

16. A frequency conversion circuit according to claim 14, wherein a second stage frequency conversion unit comprising another mixer, another local oscillator, and another band pass filter is provided at the rear of said band pass filter.

17. A frequency conversion circuit according to claim 11, wherein further provision is made of a hopping control means for performing control so that said first signal generator and said second signal generator generate output signals having frequencies related to each other at the same timings as each other.

18. A frequency conversion circuit according to claim 12, wherein further provision is made of a hopping control means for performing control so that said first signal generator, said second signal generator, said additional signal generator, and so on generate output signals having frequencies related to each other at the same timings as each other.

* * * * *